United States Patent [19]

Sauerland

[11] Patent Number: 5,643,629

[45] Date of Patent: Jul. 1, 1997

[54] METHOD FOR ADJUSTING CENTER FREQUENCY AND BANDWIDTH OF MONOLITHIC FILTERS BY PLATING THROUGH A SINGLE-APERTURE MASK ON A SINGLE SIDE OF THE FILTERS ELECTRODE PATTERN TO PLATE SELECTED AREAS OF THE PATTERN

[76] Inventor: Franz L. Sauerland, 600 Falls Rd., Chagrin Falls, Ohio 44022

[21] Appl. No.: 906,429

[22] Filed: Jun. 30, 1992

Related U.S. Application Data

[63] Continuation-in-part of Ser. No. 702,758, May 20, 1991, abandoned.

[51] Int. Cl.⁶ ..................................................... B05D 5/12
[52] U.S. Cl. ............................. 427/8; 427/10; 427/100; 427/282
[58] Field of Search .................... 427/8, 100, 282, 427/10; 333/167, 175

[56] References Cited

U.S. PATENT DOCUMENTS

| | | | |
|---|---|---|---|
| 3,864,161 | 2/1975 | Thompson | 117/212 |
| 4,112,147 | 9/1978 | Thompson | 427/100 |
| 4,273,812 | 6/1981 | Tsutsui et al. | 427/248.1 |
| 4,427,711 | 1/1984 | Martin | 427/10 |
| 4,627,379 | 12/1986 | Roberts et al. | 118/721 |
| 4,676,993 | 6/1987 | Roberts et al. | 427/10 |

*Primary Examiner*—Benjamin Utech

[57] ABSTRACT

Method and apparatus for adjusting the electrical parameters of monolithic crystal filters having an electrode pattern that includes resonator electrodes and inter-resonator gap and constitutes two coupled resonators, based on thin-film deposition on the electrode pattern of one side of the filter through a single-aperture mask, with mask and filter movable relatively to each other during the adjustment process, such as to be able to guide said deposition in response to measurements of said electrical parameters to any area of said electrode pattern for the purpose of adjusting said parameters to their target values.

1 Claim, 4 Drawing Sheets

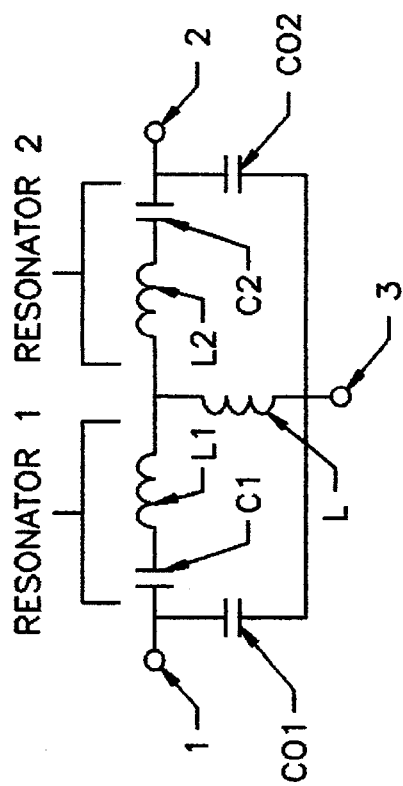
FIGURE 1 PRIOR ART
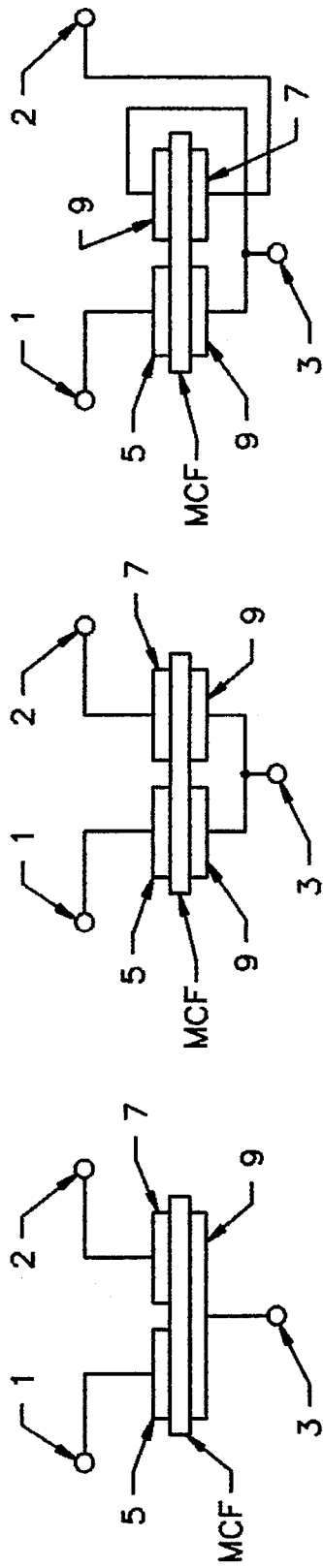
FIGURE 2 PRIOR ART
FIGURE 3 PRIOR ART
FIGURE 4 PRIOR ART

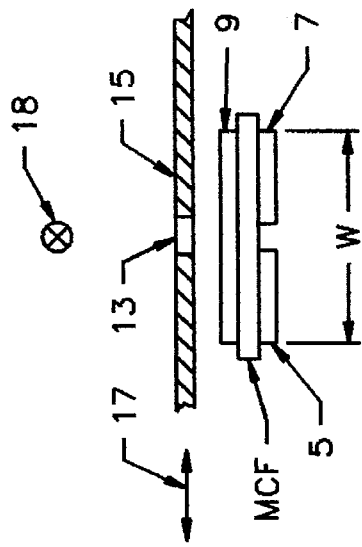
FIGURE 6
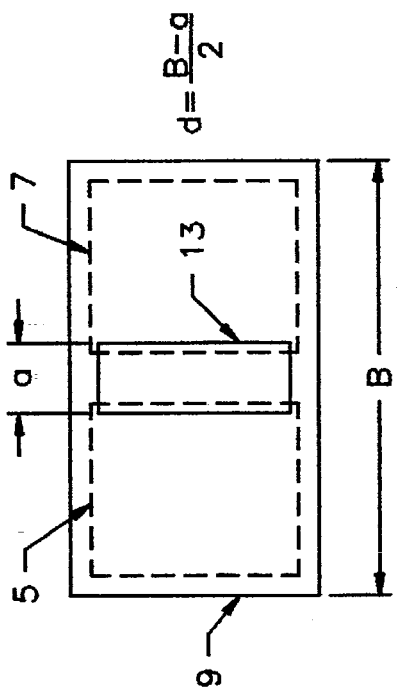
FIGURE 8
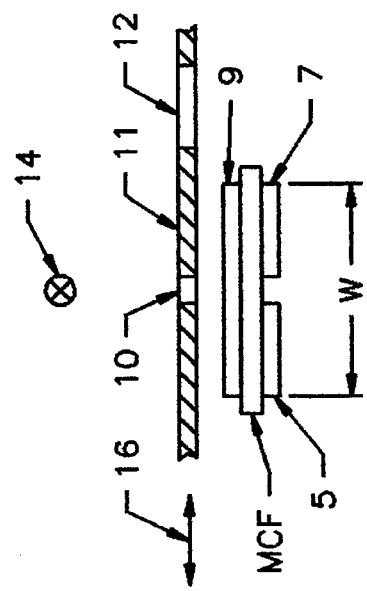
FIGURE 5
FIGURE 7 PRIOR ART

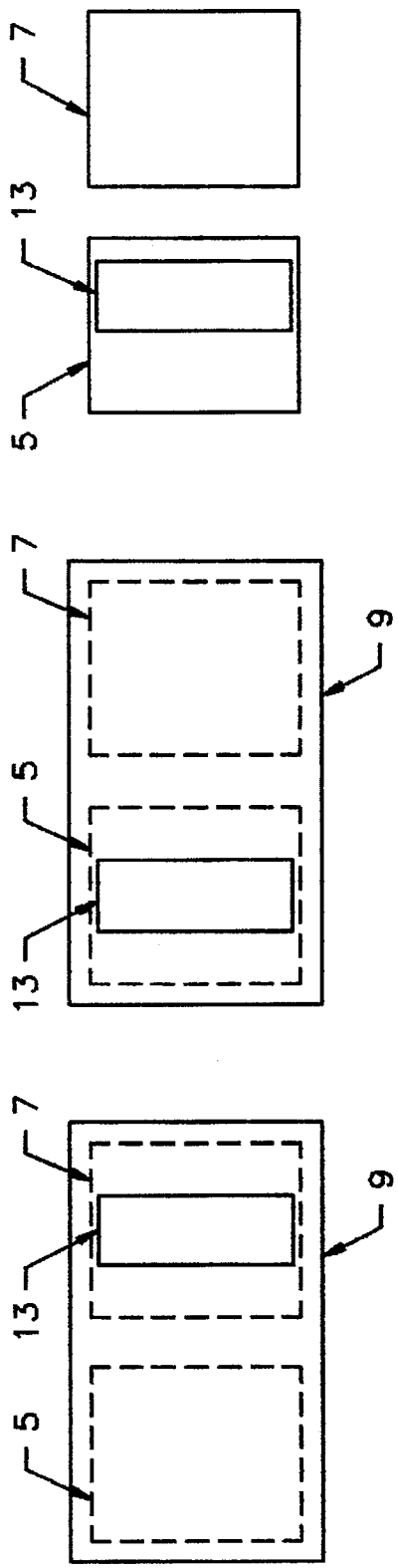
FIGURE 9
FIGURE 10
FIGURE 13
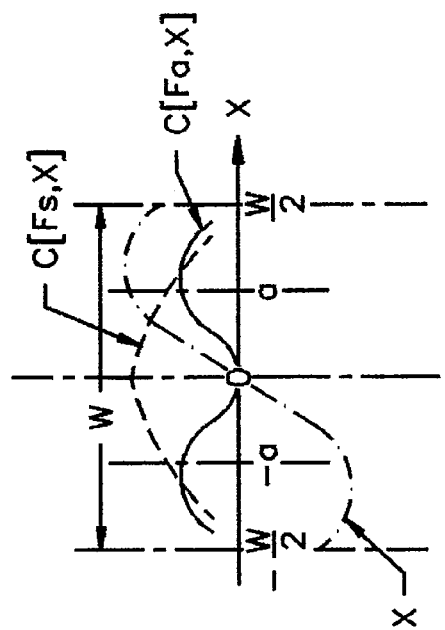
FIGURE 12
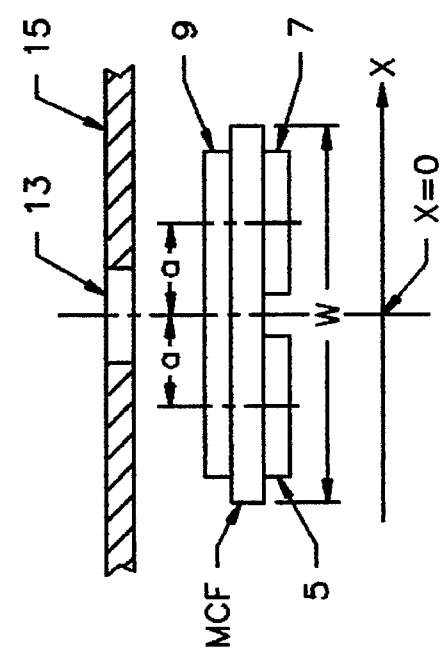
FIGURE 11

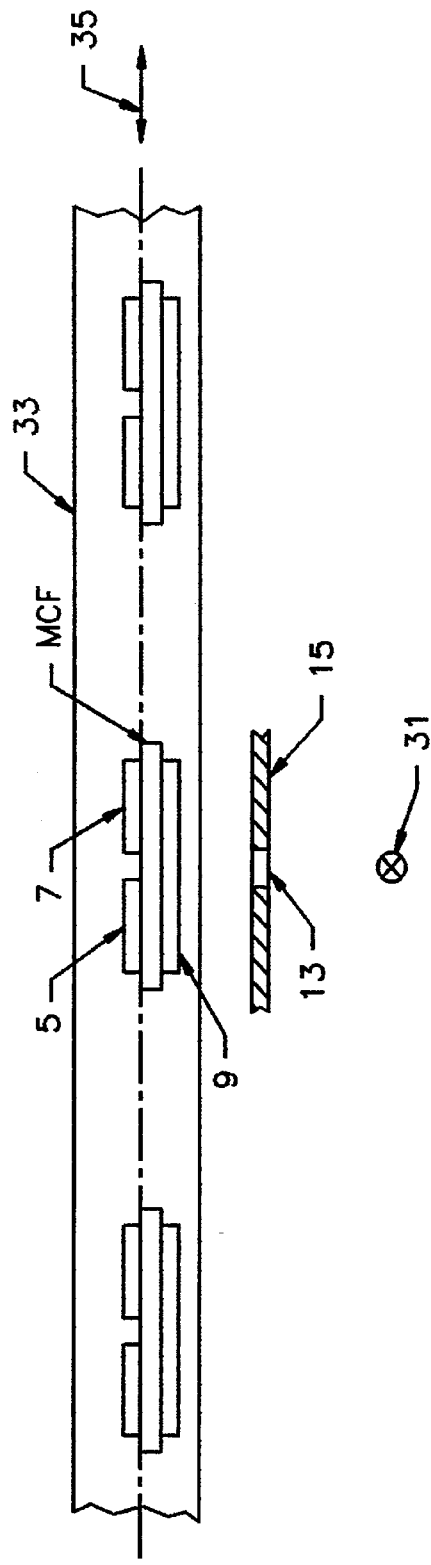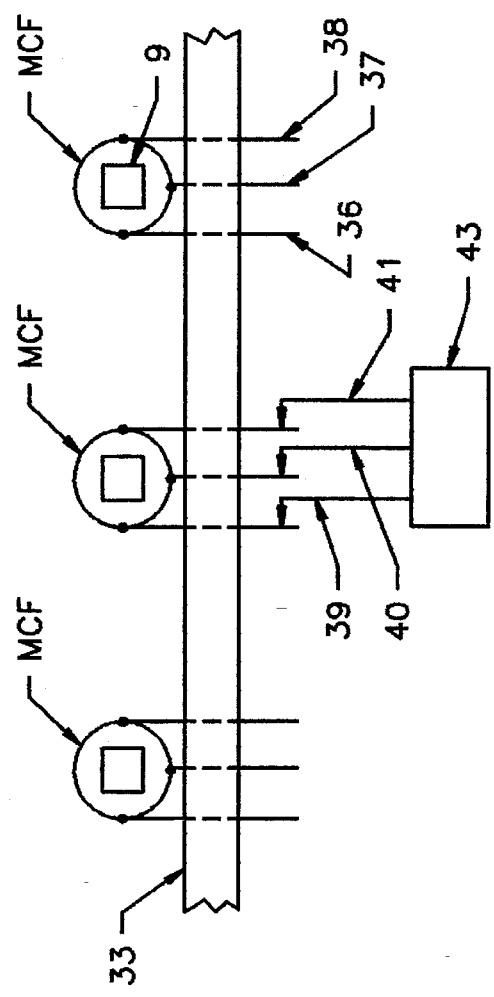

METHOD FOR ADJUSTING CENTER FREQUENCY AND BANDWIDTH OF MONOLITHIC FILTERS BY PLATING THROUGH A SINGLE-APERTURE MASK ON A SINGLE SIDE OF THE FILTERS ELECTRODE PATTERN TO PLATE SELECTED AREAS OF THE PATTERN

This is a continuation of U.S. patent application Ser. No. 07/702,758 filed May 20, 1991, now abandoned.

BACKGROUND

The prevailing methods for parameter adjustment of monolithic filters by thin-film deposition are based on deposition on both sides of the filter wafer. The present application addresses the parameter adjustment based on deposition on only one side of the filter. Prior art information on this type of approach includes the E. C. Thomson U.S. Pat. No. 4,343,827, which discloses a method for fine-tuning a monolithic crystal filter having a solid electrode on one side of the crystal wafer and a pair of split electrodes on the opposite side.

The method has several disadvantages:

1) It does not provide for bandwidth adjustment. While normally it is desirable to adjust both the center frequency and bandwidth of a filter, the referenced method can only adjust the center frequency.
2) It requires deposition through at least two different-size mask apertures onto three fixed locations of the electrode, resulting in relatively complex deposition mechanisms.
3) It requires close-tolerance alignment between electrode and apertures. This can become critical in high-frequency filters, where the electrode areas become very small and the tolerance requirements very exacting.
4) It requires adherence to fixed areas of deposition. This restricts the freedom in optimizing the adjustment process.

Items 2) and 3) will be explained in more detail in the "Description of the Invention". Items 1) and 4) are explained as follows:

The parameter adjustment process, generally refers to the adjustment of the motional inductances L1, L2, and L' of the filter's electrical equivalent circuit, which is shown in FIG. 1. The circuit represents two coupled resonators 1 and 2 and includes an input terminal 1, an output terminal 2, and a common-ground terminal 3. The inductances can be determined by various different measurement approaches, each of them comprising a set of 3 electrical measurements. The F. L. Sauerland U.S. Pat. No. 4,725,971 discloses an adjustment based on the measurement of 3 frequencies, which are related to the equivalent-circuit parameters as follows:

$$F1 = 1/2\pi \sqrt{(L1+L')C1} \quad (1)$$

$$F2 = 1/2\pi \sqrt{(L2+L')C2} \quad (2)$$

F1 and F2 are the frequencies of resonators 1 and 2, respectively. In the Thomson patent, they are called the open circuit resonance frequencies. For the following, we will assume that we are dealing with symmetric or approximately symmetric filters, which are characterized by $$L1=L2=L; \; C1=C2=C; \; CO1=CO2=CO \quad (3)$$

In this case, a "symmetric frequency" is defined as $$Fs = 1/2\pi \sqrt{(\sqrt{L1 L2} + 2L')C} \quad (4)$$

a "center" or "midband" frequency is defined as $$Fc=F1=F2,$$

and a "bandwidth" is defined as $$Bandwidth = Fa - Fs, \quad (5)$$

where Fa is called the "antisymmetric" frequency and defined as $$Fa = 1/2\pi \sqrt{\sqrt{L1 L2} \; C} \quad (6)$$

Fa is dependent on and determined by the choice of F1, F2, and Fs. The frequencies F1, F2, Fa, and Fs are in this application also called "characteristic" frequencies.

In a symmetric filter, the adjustment normally aims at equalizing F1 and F2 to the filter's target center frequency and (Fa–Fs) to the filter's target bandwidth. For this, the inductances are increased by mass deposition on the filter electrodes.

FIG. 2 shows a cross section of a monolithic crystal filter MCF with two coupled resonators 1 and 2, comprising a pair of electrodes 5 and 7 and an inter-electrode gap on one side of the wafer, and a common-ground electrode 9 on the other side. This is the schematic that will be used in the subsequent text, although the common-ground electrode may be implemented in different ways, such as shown in FIGS. 3 and 4. Electrodes 5 and 7 and the electrode areas opposite to and congruent with electrodes 5 and 7 will also be called "resonator electrodes", and the complete electrode configuration will also be called "electrode pattern".

In the conventional approach, the inductance L1 is increased by plating substantially the full area of one or both electrodes covering resonator 1. According to equation (1), this decreases the frequency F1 of resonator 1. Further, L2 is increased by plating substantially the full area of one or both electrodes covering resonator 2. According to equation (2), this decreases the frequency F2 of resonator 2. L' can be increased by plating the area of the inter-resonator gap on either side of the wafer. According to equations (1), (2), and (4), this will decrease F1, F2, and Fs, and it will decrease Fs more than F1 and F2, while it will not affect Fa. As a result, the bandwidth will be increased according to equation (5).

Consider now the adjustment method according to the Thomson patent, "which comprises the steps of a) plating additional electrode material on a selected portion of the solid electrode to balance open circuit resonant frequencies of the filter, and b) plating additional electrode material on substantially the entire solid electrode to adjust the filter to a desired midband frequency."

There is no claim nor provision for bandwidth adjustment in this method, nor is there the possibility for a bandwidth adjustment independent of the resonator-frequency adjustment: in step b) the frequencies F1, F2, Fa, and Fs are lowered simultaneously according to equations (1) to (3), but they cannot be changed independently from each other. This means that in step b) the bandwidth change will be small, and either the resonator frequencies or the bandwidth—but not both—can be adjusted to target values.

As is well-known to people skilled in the art, the lack of bandwidth adjustment is a disadvantage in the adjustment of monolithic filters. Accordingly, one purpose of this invention is to eliminate this disadvantage and to provide a method for adjusting both center frequency and bandwidth of a monolithic filter by deposition on only one side of the filter blank.

A further discussion will explain the disadvantage mentioned in item 4) above. As equations (1), (2), and (4) show, there are coupling effects that link the change of one characteristic frequency to changes in other characteristic frequencies. Since in practice, the placement of the deposition cannot be controlled exactly, the equations cannot exactly express these coupling effects. However, the coupling effects can be measured and expressed in terms of a "coupling matrix". A sample matrix might be $$
\begin{array}{cccc}
 & F1 & F2 & Fs \\
(F1-F2) & C11 & C12 & C13 \\
Fa & C21 & C22 & C23 \\
Fs & C31 & C32 & C33
\end{array}
\quad (7)
$$

This matrix describes the effect of changes in F1, F2, and Fs on Fa, Fs, and the difference (F1–FS), which is to be adjusted to zero in a symmetric filter. Practical values for the coupling coefficient might be $$
\begin{array}{cccc}
 & F1 & F2 & Fs \\
(F1-F2) & -0.9 & 0.9 & 0.05 \\
Fa & 0.6 & 0.6 & 0.2 \\
Fs & 0.5 & 0.5 & 1.0
\end{array}
\quad (8)
$$

This matrix gives vital information for the adjustment process for a given set of circumstances. For instance, coefficient C23 is relatively small. This means that a change in Fs causes only a small changes in Fa. According to equation 6 this implies that increasing L' (in order to change Fs) produces only a small change in L1 and/or L2. This in turn implies that in the case described by matrix (8), L' is being increased by deposition of a narrow strip in the vicinity of the inter-resonator gap, i.e. without simultaneously increasing L1 and/or L2. In the Thomson method, the C23 value would be close to 1, since the deposition covers the whole solid electrode, thereby decreasing L1 and L2 as well as L'. According to equations (1) to (6), this produces a major change in F1 and F2 and only a minor change in the bandwidth.

There are conventional adjustment methods, based on deposition on both sides of the filter, that provide for adjustment of both center frequency and bandwidth. They are normally based on deposition onto 3 fixed areas of the filter electrodes, and they are normally done in steps, alternating the plating between the 3 fixed electrode areas. A typical approach might first alternate between plating resonators 1 and 2 to equalize F1 and F2 and adjust them to an intermediate target, then adjust Fs, then if necessary repeat the steps until F1, F2, and Fs reach their final targets. During these steps, the coupling coefficients are essentially fixed within relatively narrow boundaries because the deposition areas are fixed. This is a limitation of the conventional approach. If the deposition areas were variable, the coupling coefficients could be changed and optimized during the process, and the number of plating steps and the total plating could be reduced. This is further explained in the description of the invention.

While there are various other conventional methods for adjusting monolithic filters, they all appear to share at least some or all of the described disadvantages. Accordingly, the primary purpose of this invention is to provide new and improved methods and apparatus for adjusting the electrical parameters of monolithic filters that are free of the described disadvantages.

SUMMARY OF THE INVENTION

In accordance with one method aspect of the invention, a method for adjusting the center frequency and bandwidth of a monolithic crystal filter having an electrode pattern that includes resonator electrodes and inter-resonator gap and constitutes two coupled resonators, based on thin-film plating on the electrode pattern on one side of the filter, and comprising the steps of a) plating a thin film on substantially the full area of the resonator electrodes on said one side of the electrode pattern, for the purpose of adjusting the two resonator frequencies and the filter's center frequency, and b) plating a thin film of a width approximately equal to the inter-resonator gap in the center of said one side of the electrode pattern, for the purpose of adjusting the filter's bandwidth.

In accordance with another method aspect of the invention, a method for adjusting the electrical parameters of a monolithic crystal filter to target values, said filter having an electrode pattern that includes resonator electrodes and inter-resonator gap and constitutes two coupled resonators, based on thin-film plating on the electrode pattern on one side of said filter, and comprising the steps of a) plating a thin film onto a first area on said one side of said electrode pattern, b) measuring the effect of said plating on said electrical parameters, c) in response to said parameter measurements, changing said area of plating to another area of said one side of said electrode pattern, suitable for adjusting said parameters toward target values, d) plating a thin film onto said other area of said electrode pattern, e) repeating steps b, c, and d for further platings until the parameter targets are reached.

In accordance with an apparatus aspect of the invention, apparatus for adjusting center frequency and bandwidth of a monolithic crystal filter having an electrode pattern that includes resonator electrodes and inter-resonator gap and constitutes two coupled resonators, based on thin-film plating on the electrode pattern on one side of the filter, comprising a) a mask with a first and a second aperture, said first aperture having substantially the dimensions of one of said resonator electrodes, and said second aperture having substantially the dimensions of said inter-resonator gap, said mask facing said one side of the electrode pattern and having relative mobility with respect to said filter such as to allow the alignment of said first aperture opposite one and the other of said resonator electrodes, as well as the alignment of said second aperture opposite said inter-resonator gap, said respective alignments being called the plating positions, b) an evaporation source for plating a thin film through said apertures when they are aligned in their respective plating positions, c) means for electrically contacting the terminals and for measuring the resonator frequencies and bandwidth of said filter, d) means for evaluating said measurements and, in response to said evaluation, determining and causing the movements of said first and second apertures into respective plating positions for adjusting the center frequency and bandwidth of said filter.

In accordance with another apparatus aspect of the invention, apparatus for adjusting the electrical parameters of a monolithic crystal filter to target values, said filter having an electrode pattern that includes resonator electrodes and inter-resonator gap and constitutes two coupled resonators, based on thin-film plating on the electrode pattern on one side of said filter, comprising a) a mask with a single aperture, said aperture having a width preferably smaller than the width of the resonator electrodes and larger than the width of the inter-resonator gap, b) a mounting means for the filter and mask that affords mobility of said filter and mask relative to each other such as to allow alignment of said aperture opposite any part of said one side of the electrode pattern, said different alignments being called plating positions, c) an evaporation source for plating a thin film through said aperture when it is in a plating position, d) means for electrically contacting the terminals of said filter and for making measurements of the electrical parameters of said filter, e) a plating control means for e-1) evaluating said measurements when said aperture is in a plating position, and for determining a new plating position suitable for changing said electrical parameters to new values that converge toward target values, e-2) moving said aperture to said new plating position for controlled plating to said new parameter values, e-3) repeating steps e-1) and e-2) until the target values are reached.

The invention offers the following advantages over conventional approaches:

a) simpler construction, in that it requires a mask with only a single aperture.

b) substantially reduced tolerance requirements for the initial mask alignment, in that the mask aperture may be substantially smaller than the filter electrode and can be moved in relation to it, c) substantially increased flexibility in the adjustment process, in that the deposition is not restricted within fixed boundaries but can be directed to any area of the filter electrode.

BRIEF DESCRIPTION OF THE DRAWINGS

For a better understanding of the invention, reference is made to the following description, taken in connection with the accompanying drawings.

FIG. 1 shows an electrical equivalent circuit for a monolithic crystal filter comprising two coupled resonators.

FIG. 2 shows a cross section of a monolithic filter wafer with an electrode pattern comprising a pair of electrodes and an inter-electrode gap on one side and a solid common-ground electrode on the opposite side.

FIG. 3 shows the cross section of a monolithic filter wafer with an electrode pattern comprising a pair of electrodes and an inter-resonator gap on each side. One pair of electrodes on one side has been electrically interconnected to form a common-ground electrode.

FIG. 4 shows the cross section of a monolithic filter wafer with an electrode pattern comprising a pair of electrodes and an inter-resonator gap on each side. One electrode on one side has been electrically interconnected with the diagonally opposite electrode to form a common-ground electrode.

FIG. 5 shows a simplified schematic, comprising a monolithic filter and a mask with two apertures, for one approach according to the invention.

FIG. 6 shows a simplified schematic, comprising a monolithic filter and a mask with a single aperture, for another approach according to the invention.

FIG. 7 shows an electrode pattern of a monolithic filter and a superimposed pattern of a conventional mask aperture.

FIG. 8 shows an electrode pattern of a monolithic filter and a superimposed pattern of a mask aperture according to the invention.

FIGS. 9 and 10 show electrode patterns of a monolithic filters with a superimposed pattern of a mask aperture according to the invention shown in two different positions.

FIG. 11 shows an approach according to the invention, comprising a monolithic filter, a mask, and a scale x for the relative movement of mask versus filter.

FIG. 12 shows curves for three coupling coefficients as a function of x.

FIG. 13 shows another electrode pattern of a monolithic filter with a superimposed pattern of a mask aperture according to the invention.

FIG. 14 shows the top view of another simplified schematic for an approach according to the invention for adjusting the electrical parameters of a monolithic filter by thin-film deposition.

FIG. 15 shows a side view of the arrangement per FIG. 9, additionally including means for contacting the filter terminals and for measuring the filter parameters and controlling the plating.

DESCRIPTION OF THE INVENTION

FIG. 5 shows one adjustment scheme according to the present invention. It includes a monolithic filter MCF with an electrode pattern comprising two electrodes 5 and 7 on one side and a common ground electrode 9 on the other side, faced by a mask 11 with two apertures 10 and 12. Aperture 10 has a width approximately equal to the width of the gap between electrodes 5 and 7, while aperture 12 has a width approximately equal to the width of electrodes 5 and 7. Filter MCF and mask 11 can be moved relatively to each other in the direction of arrows 16. An evaporation source 14 is positioned such that it can deposit a thin film within the width W, which is approximately equal to the width of the common ground electrode 9.

The arrangement can be used for parameter adjustment as follows:

First, the resonator frequencies F1 and F2 are lowered and equalized. This is done by adjusting the relative position of filter and mask such as to alternately direct deposition through aperture 12 onto the areas on electrode 9 that are opposite to the two electrodes 5 and 7.

Second, the bandwidth is adjusted by lowering the symmetric frequency Fs. This is accomplished by adjusting the relative position of filter and mask such as to direct deposition through aperture 10 onto the area on electrode 9 that is opposite to the gap between electrodes 5 and 7. The first and second steps can be repeated until the targets for the resonator frequencies and bandwidth are reached.

The advantage of this adjustment scheme over the prior-art scheme according to Thomson is that it provides for adjustment of both center frequency and bandwidth of the filter.

FIG. 6 shows another adjustment scheme according to the present invention. It comprises a monolithic filter MCF with an electrode pattern comprising two electrodes 5 and 7 on one side and a common ground electrode 9 on the other side, faced by a mask 15 with a single aperture 13. Aperture 13 has a width preferably not larger than the width of electrodes 5 and 7 and not smaller than the width of the gap between electrodes 5 and 7. An evaporation source 18 is positioned such that it can deposit a thin film through aperture 13. Mask and filter can be moved relative to each other in the direction of the arrows 17, such that deposition can be directed during the adjustment process to any area of electrode 9.

The advantages of this approach over prior-art methods were mentioned in the "Summary" and can be further explained as follows:

a) the mechanical design is simplified, in that the need for multiple apertures or multiple deposition mechanisms has been eliminated.

b) the tolerance requirements, for the initial mask alignment have been reduced significantly. This can be seen from FIGS. 7 and 8.

FIG. 7 shows a conventional mask aperture 11, such as according to the cited Thomson patent, superimposed on the solid filter electrode 9. Normally the deposition is to cover as much of the electrode area as possible, but none of the surrounding areas. To keep the deposition from spilling beyond the electrode boundaries, the mask must be initially aligned laterally within a tolerance of +/−D/2, where the value for D is given in FIG. 7.

FIG. 8 shows a mask aperture 13 according to the invention, superimposed on the solid filter electrode 9. The aperture is narrower than the width of electrode 9. Before starting the deposition, the aperture must be aligned anywhere within the area of the electrode. For this, the tolerance is +/−d/2, where the value for d as given in FIG. 8 is substantially larger than the value for D per FIG. 9.

c) the flexibility of the adjustment process is increased substantially, in that the deposition is not restricted by fixed mask boundaries but can be directed to any area of the electrode.

This can be explained by reviewing the adjustment process, with reference to FIGS. 9 and 10, which show two further positions of the aperture 13 superimposed on the common ground filter electrode 9, as well as the outlines of the two resonator electrodes 5 and 7 on the opposite filter side.

The arrangement can be used for parameter adjustment as follows:

First, the resonator frequencies F1 and F2 are lowered and equalized. This is done by adjusting the relative position of filter and mask such as to alternately direct deposition through aperture 13 onto the areas on electrode 9 that are opposite to the two electrodes 5 and 7, such as shown in FIGS. 9 and 10.

Second, the bandwidth is adjusted by lowering the symmetric frequency Fs. This is accomplished by adjusting the relative position of filter and mask such as to direct deposition through aperture 13 onto the area on electrode 9 that is opposite to the gap between electrodes 5 and 7.

The first and second steps can be repeated until the targets for the resonator frequencies and bandwidth are reached.

In this approach, the choice of the aperture width is important and is usually a compromise between two extremes:

If the aperture is narrow, such as on the order of the inter-resonator gap width, the coupling coefficient C23 will be small, allowing a bandwidth adjustment that has a negligible effect on the resonator frequencies F1 and F2. In other words, according to equations 5 and 6, the bandwidth can be adjusted by lowering the symmetric frequency Fs without simultaneously lowering the antisymmetric frequency Fa. However, the deposition for the adjustment of F1 and F2 covers a relatively small area opposite electrodes 5 and 7, which can produce undesired effects, such as spurious filter responses.

On the other hand, as the aperture is widened, the bandwidth adjustment will be accompanied by an increasing effect on lowering F1 and F2 until, when the aperture has the same width as electrode 9, it reaches the limitations of the prior-art method according to Thomson.

For the method according to FIG. 6, the coupling matrix can be expressed in terms of the aperture's position on the parameters (F1–F2), Fa, and Fs. This can be explained by reference to FIG. 11, which shows a monolithic filter MCF with two resonator electrodes 5 and 7 and a common-ground electrode 9. Aperture 13 of a mask 15 is positioned in the "center position", which for the present purpose is defined as the center of the gap between electrodes 5 and 7. A horizontal scale x is shown, with x=0 at the "center position". Further, the center lines for electrodes 5 and 7 are shown as being offset from the "center position" by x=−a and x=a, respectively. With, this, matrix (8) can be re-written in terms of the aperture's x-position as follows

|         | $x=-a$ | $x=0$ | $x=+a$ | (9) |
|---------|--------|-------|--------|-----|
| (F1–F2) | −0.9   | 0.9   | 0.05   |     |
| Fa      | 0.6    | 0.6   | 0.1    |     |
| Fs      | 0.5    | 0.5   | 1.0    |     |

So far, the described adjustment sequence for the arrangement of FIG. 6 has been similar to the conventional approach in that the deposition has been implicitly restricted to 3 fixed areas of the electrode, and the coupling coefficients have been restricted accordingly. However, in the approach according to the invention, the deposition can be directed to any area of the electrode, and the coupling coefficients are continuously adjustable within their maximum and minimum limits.

If for example any one of the aperture positions in matrix (9) is changed, the coupling coefficients for that position will be changed. If for example the position x=−a in matrix (9) is changed to x=−a/2, the new matrix may look as follows:

|         | $x=-a/2$ | $x=0$ | $x=+a$ | (10) |
|---------|----------|-------|--------|------|
| (F1–F2) | −0.6     | 0.9   | 0.05   |      |
| Fa      | 0.5      | 0.6   | 0.1    |      |
| Fs      | 0.7      | 0.5   | 1.0    |      |

Compared to matrix (9), the values for coefficients C11, C12, and C13 are different in the new matrix (10). For example, C11 is smaller, because now the deposition is only partially covering the electrode area of resonator 1. Conversely, C13 is larger, because now the deposition is partially covering the area of the inter-electrode gap.

Matrix (10) can be written in a more general way in terms of three sets of coupling coefficients that are functions of x:

$$C<(F1-F2), x>, C<Fa, x>, C<Fs, x> \quad (11)$$

By extending the reasoning used for C11 and C13 above to the coefficients (11), or by measuring the dependence of (F1–F2), Fa, and Fs on the aperture position x, one can determine and plot the values of the coupling coefficients (11) as a function of x. This is shown in a qualitative way in FIG. 12 over the width W of the common-ground electrode 9 of FIG. 11. The curve shapes for the coupling coefficients are strongly dependent on the relative width of aperture, resonator electrode, and inter-resonator gap.

FIG. 12 illustrates that if the aperture position is continuously adjustable, the coupling coefficients are continuously adjustable within minimum and maximum limits. This is an important feature. If, for example, during the adjustment process, both (F1–F2) and Fs are to be changed to specific intermediate target values, the aperture position x and thereby the coefficients C <(F1–F2),x> and C<Fs,x> can be chosen such that the two targets can be reached in a single deposition step. This is not possible in the conventional fixed-mask approach.

In an implementation of an adjustment system according to the invention, a step motor is used to provide the relative motion of mask versus filter. Electronic instrumentation, which can be of a conventional type, such as described in the Sauerland patent, is used to measure the characteristic frequencies. A computer is used to evaluate the coupling coefficients from these measurements, correlate them with the aperture position via the step motor position, and to memorize and if necessary update them. Various algorithms can then be used to choose the sequence and position for the aperture movement for optimum convergence of the adjustment process to the target values.

The adjustment does not have to begin with the aperture in any specific position. For high-frequency filters, the electrode pattern may be so small that an exact initial alignment is difficult to achieve. In the approach according to the invention, it is sufficient that the initial alignment falls anywhere within the confines of the electrode pattern. A first deposition in this position and a subsequent measurement of the coupling coefficients will provide information about the relative position of aperture versus electrode pattern. This information can then be used to guide the next deposition step.

The adjustment is not limited to a stepwise approach: with fast means for measuring and computing, the plating control can be done in real time, such that the aperture can be moved continuously rather than in steps.

Further flexibility is provided by the possibility of either increasing the bandwidth by depositing in the center per FIG. 8, or by decreasing it by depositing on the electrode edges opposite the center. The bandwidth decrease can be understood as follows: when plating on the outer electrode edges, L1 and L2 are increased, but L' is not. According to equations (4) and (6), the increase in L1 and L2 will lower Fa more than Fs. As a result, (Fa–Fs) will be decreased.

The approach is not limited to filters of the type depicted in FIG. 2 but can also be applied to other filter types, such as shown in FIGS. 3 and 4. For example, FIG. 13 shows an aperture 13 superimposed on two filter electrodes 5 and 7. In this case, the aperture can be moved anywhere within the confines of the two electrodes 5 and 7, and the coupling coefficients can be adjusted accordingly, although within a more limited range than for the configurations shown in FIGS. 8, 9, and 10.

In some cases it may be desirable to protect the deposition from spilling over the electrode borders. In these cases, an additional fixed mask may be used to cover the filter such that only the electrode areas can be exposed to deposition.

FIG. 14 shows the simplified top view of another scheme according to the invention, suitable for sequential adjustment of multiple filters. Three filters MCF are shown mounted on a "carrier" 33. Facing one filter is a mask 15 with an aperture 13. An evaporation source 31 is arranged such as to be able to evaporate through aperture 13 onto the solid filter electrode 9. Carrier 33 can be moved laterally as indicated by the arrows 35, such that all filters can be sequentially moved into position opposite mask 27 for adjustment. During the adjustment, carrier 33 can further be moved back and forth in the direction of the arrows 35 such as to direct the deposition to any desired area of the filter electrode.

FIG. 15 shows a side view of carrier 33 of FIG. 14 with 3 filters MCF, each of whose three contact pins 36, 37, 38 protrude through the carrier and can be accessed by contacts 39, 40, 41 for connection to circuit 43, which comprises means for parameter measurement and plating control. This circuit can be of a conventional type, such as described in the cited Sauerland patent.

In summary, two fundamental embodiments of the invention have been described, both based on thin-film deposition through a mask on the electrode pattern on one side of a monolithic filter, and both using relative mobility of the mask versus the filter. One embodiment comprises deposition through a single mask aperture onto any part of the electrode pattern. The other embodiment comprises deposition through two different mask apertures, with one aperture serving to direct the deposition to two areas offset from the center of the electrode pattern and essentially covering the areas of the two resonator electrodes, and the other aperture serving to direct the deposition to a narrow area in the center of the electrode pattern. From the description it will be obvious to those skilled in the art that various changes and modifications may be made—such as increasing the number of apertures beyond two—without departing from the invention, and it is aimed, therefore, in the appended claims to cover all such changes and modifications as fall within the true spirit and scope of the invention.

I claim:

1. A method for adjusting center frequency and bandwidth of a monolithic filter having an electrode pattern including at least two resonators separated by an inter-resonator gap, the method comprising a) positioning one side of the filter's electrode pattern adjacent a mask with a first and second aperture, said first aperture having substantially the same dimensions as the resonator electrodes, and said second aperture having substantially the dimensions of said inter-resonator gap, b) positioning said first aperture opposite each of said two resonator electrodes and depositing evaporated material through said first aperture to adjust the frequency of said resonators, c) positioning said second aperture opposite said inter-electrode gap and depositing evaporated material through said second aperture to adjust the bandwidth of said filter.

* * * * *